(12) United States Patent
Beharrell

(10) Patent No.: US 7,482,967 B2
(45) Date of Patent: Jan. 27, 2009

(54) DIGITAL ELECTRONIC SUPPORT MEASURES

(75) Inventor: George Peter Beharrell, Salisbury (GB)

(73) Assignee: The Secretary of State For Defence (GB)

( * ) Notice: Subject to any disclaimer, the term of this patent is extended or adjusted under 35 U.S.C. 154(b) by 160 days.

(21) Appl. No.: 10/554,793

(22) PCT Filed: Apr. 30, 2004

(86) PCT No.: PCT/GB2004/001911

§ 371 (c)(1),
(2), (4) Date: Oct. 28, 2005

(87) PCT Pub. No.: WO2004/097450

PCT Pub. Date: Nov. 11, 2004

(65) Prior Publication Data

US 2007/0090988 A1 Apr. 26, 2007

(30) Foreign Application Priority Data

Apr. 30, 2003 (GB) ................................. 0309807.6

(51) Int. Cl.
*G01S 7/40* (2006.01)
*G01S 7/02* (2006.01)
*G01S 13/00* (2006.01)
*H03D 3/00* (2006.01)

(52) U.S. Cl. .............................. 342/20; 342/13; 342/89; 342/175; 342/192; 342/195; 342/196

(58) Field of Classification Search ............. 342/13–20, 342/89, 90, 175, 192–197
See application file for complete search history.

(56) References Cited

U.S. PATENT DOCUMENTS 3,623,089 A * 11/1971 Bossert ........................ 342/195
3,660,844 A * 5/1972 Potter ........................... 342/20
4,025,920 A * 5/1977 Reitboeck et al. ............. 342/13

(Continued)

FOREIGN PATENT DOCUMENTS

GB 2 160 686 A 12/1985

OTHER PUBLICATIONS

H. K. Mardia, "An Advanced Adaptive Front End for ESM," Conference Proceedings MM92 (1992), pp. 43-48.

*Primary Examiner*—Bernarr E Gregory
(74) *Attorney, Agent, or Firm*—Dean W. Russell; Kilpatrick Stockton LLP

(57) ABSTRACT

An apparatus for characterising an input signal within abroad frequency band by comparing the same input signal in a plurality of channels, in order to operate digital Electronic Support Measures (ESM) which require a broad bandwidth to function. The apparatus comprises one or more signal input bands spread across the broad frequency band, a means of splitting the input signal in each input band into a plurality of separate channels, and a means of sampling each channel, wherein the sampling means in each channel runs at a different clock rate from sampling means in each of the other channels within the input bands, so as to remove the ambiguities inherent in frequency aliasing.

21 Claims, 3 Drawing Sheets

U.S. PATENT DOCUMENTS

| | | | |
|---|---|---|---|
| 4,170,008 A * | 10/1979 | Goebel et al. | 342/16 |
| 4,682,172 A * | 7/1987 | Kuhrdt | 342/15 |
| 4,689,622 A * | 8/1987 | Kuhrdt | 342/14 |
| 4,712,109 A * | 12/1987 | Galati et al. | 342/195 |
| 4,860,013 A * | 8/1989 | Huntley | 342/20 |
| 5,099,243 A * | 3/1992 | Tsui et al. | 342/14 |
| 5,323,103 A * | 6/1994 | Choate et al. | 342/20 |
| 6,043,771 A * | 3/2000 | Clark et al. | 342/13 |
| 6,157,820 A | 12/2000 | Sourour et al. | |
| 6,400,305 B1 * | 6/2002 | Kuhn | 342/20 |
| 6,448,921 B1 * | 9/2002 | Tsui et al. | 342/13 |
| 6,531,979 B1 | 3/2003 | Hynes | |
| 2001/0040525 A1 | 11/2001 | Springer et al. | |
| 2001/0040930 A1 | 11/2001 | Abbey | |

* cited by examiner

DIGITAL ELECTRONIC SUPPORT MEASURES

CROSS REFERENCE TO RELATED APPLICATIONS

This application is the U.S. national phase of International Application No. PCT/GB2004/001911 filed on Apr. 30, 2004 published in English on Nov. 11, 2004 as International Publication No. WO 2004/097450 A1, which application claims priority to Great Britain Application No. 0309807.6 filed on Apr. 30, 2003, the contents of which are incorporated by reference herein.

FIELD OF THE INVENTION

This invention relates to the field of digital electronics and particularly to signal processing in Electronic Support Measures (ESM) for Radar Systems.

BACKGROUND OF THE INVENTION

ESM is the term given to the electronic procedures involved with detecting and identifying a threat and other electromagnetic signals as part of a military platform's defensive capabilities. ESM operates passively, and detects radar signals over a broad frequency range, typically over the band 0.5 to 18 GHz. ESM combines several processes in order to operate effectively. These processes include detection, direction finding, signal analysis and parameter estimation. Much of the circuitry currently employed for carrying out these functions is based on analogue technology. A design approach based on multiple narrow-band circuits, which ideally is required to handle the modern radar signal environments, is expensive and therefore it is desirable to minimise the amount of such circuitry in any radar ESM system. The limitations of wide-band receiver systems in handling more than one signal at a time are well known, as is the high cost of analogue channelised architectures.

Digital receiver technology, on the other hand, has a wide range of commercial and other military applications. This potentially offers a much better platform upon which to build future Electronic Support Measures.

The existing digital circuitry cannot cope with the wide frequency coverage requirements of Electronic Support Measures and this has militated against the digital approach, necessitating extensive signal conditioning to map the overall input frequency range into multiple narrower bandwidth channels for digital processing. To handle the full frequency range, it is currently necessary to use multiple digital receivers, which adds significantly to the cost and complexity of any system. The recognised solutions to the problem are to limit the input frequency range, or else adopt a scanning strategy to cover a wider band, but at the cost of extended intercept times.

However, in most channelised architectures for radar ESM, the receiver occupancy at any time is fairly sparse, indicating that the resources available are not well utilised.

Indeed the Radar Electronic Support Measure environment is characterised by sparse occupancy of the signal space in both time and frequency. At any one time, a fairly small number of signals, each of modest bandwidth is incident upon the system One of the chief challenges in achieving the goal of developing a digital Electronic Support Measure for radar is to process the wide frequency band required with a much narrower bandwidth receiver, of the order of 1-2 GHz. This bandwidth is well within the scope of current digital receiver technology. Current applications of digital receivers are restricted to processing a small part of the total frequency spectrum which is enforced by narrow band pass filters that maintain the fidelity of the digitisation process.

Due to the small number of signals appearing simultaneously, it is possible to exploit the aliasing that occurs in an under sampled (sub-Nyquist) digital receiver to collapse a broad input spectrum into a much smaller spectrum, represented by the processing bandwidth of a digital receiver. However, this aliasing process introduces ambiguities in the frequency measuring process which can severely complicate subsequent analysis of the signal unless they are resolved. At multiples of the sampling frequency, the measured output frequency range folds back on itself, and as noted, several different input frequencies then give rise to the same output frequency (whence the ambiguity).

One way of solving this problem involves splitting the input signal into two signals, subjecting one to a time delay, and running the two signals produced through two channels with the same processors. Phase comparison between the spectra from the two channels will provide an indication of frequency that may resolve the ambiguities. This goes some way towards solving the problem, but still leaves discontinuities at multiples of the sampling frequency, where the frequency of the input signal cannot be determined.

SUMMARY OF THE INVENTION

The present invention provides an apparatus for characterising an input signal within a broad frequency band by comparing the same input signal in a plurality of channels, the apparatus comprising one or more signal input bands spread across the broad frequency band, a means of splitting the input signal in each input band into a plurality of separate channels, and a means of sampling each channel, characterised in that the sampling means in each channel runs at a different clock rate from sampling means in each of the other channels within the input band.

Such apparatus achieves resolution of the inherent frequency ambiguities at signal levels appropriate for detection requirements, which in general are lower than those needed for phase measurement, as in the current art. A further advantage of employing this invention is that discontinuities at multiples of the sampling rates can be well covered, and overall there are fewer areas of ambiguity. These can thus be set to optimise the system with far greater freedom, and the apparatus requires a minimum of only two channels to operate the system.

Since there are now different clock measurements for the same input frequency, there are two different outputs. The difference between the two clock rates causes a known frequency relationship between the two output signals, which changes in known, stepped values at integral multiples of the sampling frequency. This known change in the relationship between the two signals allows the actual input frequency to be deduced, as it becomes possible to calculate the number of multiples of the sampling frequency at which the input frequency is being read. By appropriate choice of sampling rates, a unique mapping of measured frequency in two or more channels can be made to the input frequency over a wide frequency range.

For many ESM threat warning applications, knowledge of exact frequency is not important. In such situations. in which frequency ambiguities need not be resolved, such a system would conveniently be coupled to a circular array, feeding into a Butler matrix. Circular arrays have a direction finding output that is independent of frequency, and in such a system where there can be inherent frequency ambiguity, this provides a further advantage in that angle of arrival can be measured even in circumstances where frequency ambiguity resolution cannot be achieved.

The method as described can collapse frequency bands of the order of 6-7 GHz with a high degree of accuracy. Above these frequencies, due to limitations in sampling performance, it becomes advantageous to divide the input frequency into a number of sub-bands. For example, in a bandwidth of 0.5 GHz to 18 GHz, it would be convenient to divide the input into three sub-bands having bandwidths of the order of 0-7 GHz, 6.5-13 GHz and 12.5-18 GHz respectively. In this way, the performance of the spectrum calculations is maintained with practical sample gate technology.

Each of these sub-bands can be treated in the same way as described in the current invention with its own dedicated circuitry, or the bands may be recombined, and dealt with by a single set of circuitry. Naturally, this second method allows a significant reduction in the cost of the system, but it re-introduces ambiguity in frequency measurement between the three sub-bands.

Any ambiguity introduced by sub-banding can be resolved by adding an additional time-delayed channel sampling at the same rate as one of the un-delayed channels. If the time delay is imposed before down-conversion then the phase shift between the spectra from the delayed and un-delayed channels indicates the input frequency. Only coarse phase measurement is required to determine the sub-band in which the detected signal lies, so there is only minor impact on the signal power required for detection and frequency measurement.

There is clearly considerable flexibility in designing the sub-band architecture to achieve an advantageous balance of total bandwidth covered, acceptable ambiguity, and available sample gate technology.

Advantageously, a mathematical algorithm capable of frequency-domain transformations is used to process the digital signal. The most common algorithm is a Fourier Transform, although any suitable algorithm, for example a Hartley transformation, could equally be employed. For illustrative purposes, this discussion will focus on the use of a Fourier Transform. The use of distinct and different sample rates for each channel means that the time required to capture the all the data points for each of the parallel Fourier Transforms is different in each channel. If all the channels were to process the same number of points in their Fourier Transforms, there would a gradual time slip between the channels, which would eventually invalidate subsequent comparative processing between them A simple way around this problem is to truncate the "faster" channels, such that some data is discarded, or to pad the slower channels with "zero" data elements, to fill the Fourier Transform. Thus, for example, if the nominal Fourier Transform size is 1024 points, fitting a classic radix-2 fast algorithm, a second channel clocked at a faster rate might collect 1050 data samples in the same time, but this data set would be truncated to 1024 points so that the same transform can be used. Likewise a slower channel would be padded with zero data elements to make 1024 data points in total, in the same time frame as the other channels.

Such a scheme is viable, but has a few complications, because the Fourier Transform bin sizes scale with the sample rate, as does the mapping between Fourier Transform bin number and actual frequency. These effects can be handled, but do complicate the subsequent analysis.

An alternative approach is to relax the constraints on the use of the radix-2 fast Fourier Transform (FFT) algorithms, and to consider the more general case of prime factor FFTs. Numbers that have as factors most of the low value prime numbers can be used as the number of points processed in an efficient FFT algorithm.

In an apparatus therefore, in which a data channel is split into parallel paths which are then sampled and processed by a Fourier Transform, if the ratio of the number of points employed in each Fourier Transform to the sample rate is identical, the data capture frames will be of identical duration, and there will be no time slip between the channels. Thus, for example, in the ESM case, one might employ one channel with sample rate of 1000 MHz, using a 1000-point prime-factor FFT algorithm, and a second channel sampled at 1024 MHz, using a classic 1024 point FFT.

Such an apparatus has the useful property that the frequency bins in the channels have exactly the same size, and exactly the same scaling to real frequency.

By employing such a method, comparison between the two channels becomes very straightforward, as the sum and difference relationships that exist between the frequencies seen in the channels after aliasing are now expressed as simple relationships between frequency bin numbers, and can be handled in a digital apparatus by simple manipulations of the bin address.

A further advantage of this apparatus is that because it implements an identical set of filters in each channel, signal phase is preserved identically in each channel, even for signals that are aliased into a different frequency bin in each channel. This is so despite the difference in sample frequency. This feature allows phase comparison to be undertaken for the same signal in channels operating with different sample rates. Thus the receiver in the present invention may be further simplified, as one of the three digital receiver channels can be removed, and frequency difference and phase difference information required to span the full frequency range can be captured in only two channels.

The invention might now be employed in many ways in the context of a full ESM system. For example, the receiver may be either a circular interferometric array, or a linear interferometer, each of which might generate 4 outputs whose relative phase must be measured in order to measure the signal direction. An ESM system, with either of two alternative antenna arrangements, as shown below can now be postulated, using only 4 digital receiver channels, each running at a different sample rate.

BRIEF DESCRIPTION OF THE DRAWINGS

An embodiment of the present invention will now be described with reference to the following figures, which describe the circuitry necessary to collapse the frequency, whilst at the same time providing sufficient information to identify the source.

FIG. 4 shows modification of FIG. 3 adapted to identify the sub-band the signal has come from.

DETAILED DESCRIPTION

Figure 1:
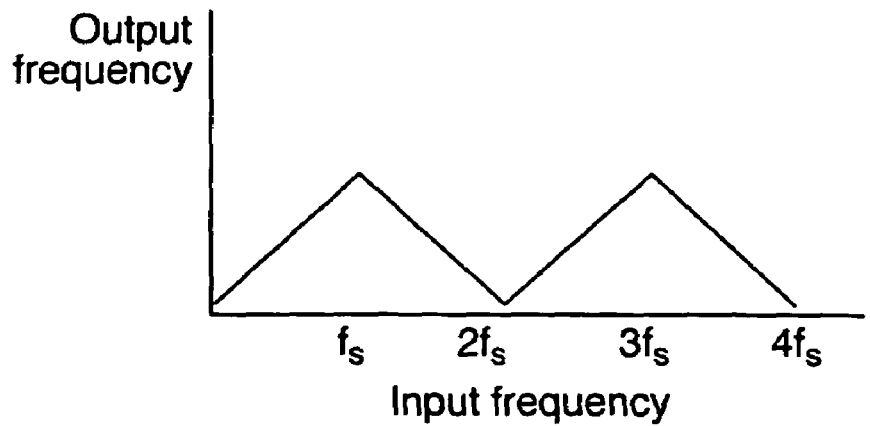
FIG. 1 illustrates the ambiguities inherent in the methods used in the prior art, assuming complex data samples.

Turning first to FIG. 1, the sampling frequency is $f_s$. This figure shows that at multiples of this frequency the measured output frequency 'folds back' on itself, so that several different input frequencies may give rise to the same output frequency.

Figure 2:
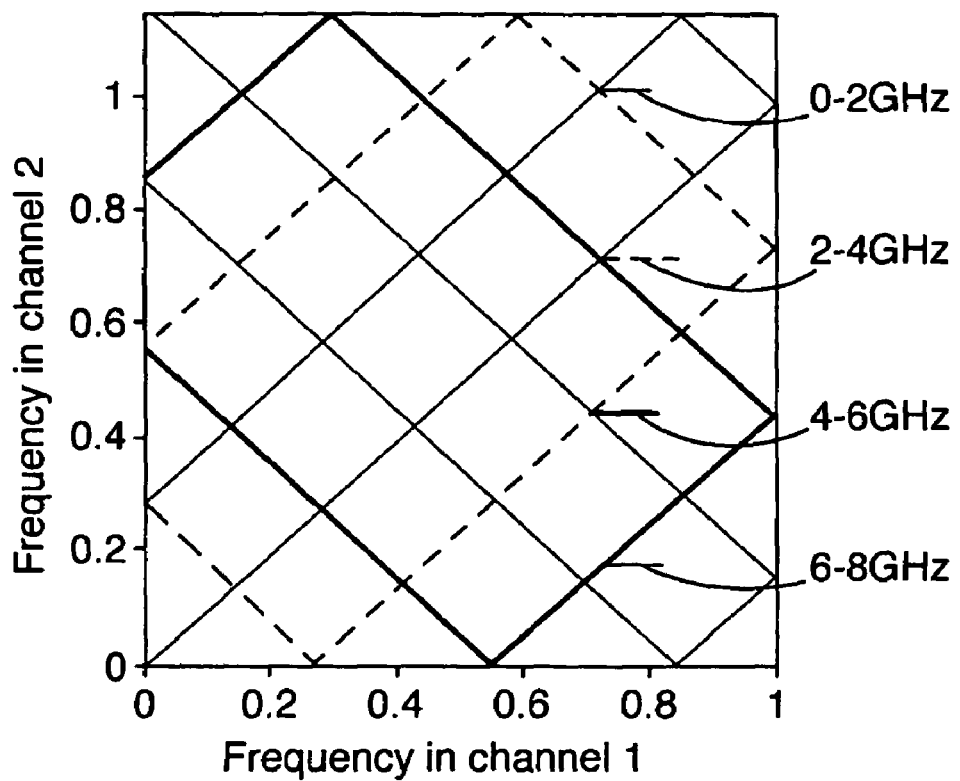
FIG. 2 shows how the ambiguities may be resolved by means of the present invention

When the same input signal is run at two different clock rates, a known difference in the output signal between the two frequencies is created, which increases at multiples of the sampling frequency. FIG. 2 plots the frequency measured in each of two channels as the input frequency increases, starting at the origin, and moving around the diagram in an anti-clockwise spiral, reflecting off the main axes as shown. All lines have slope +1 or −1 Where the gradient is +1, the relationship between the two frequencies is characterised by a common difference, and likewise, where the gradient is −1, the two frequencies sum to a constant value. The sub-band from which the signal originated can be recognised by identifying the known set of characteristic sum and difference frequency relationships between the outputs from the two channels.

Figure 3:
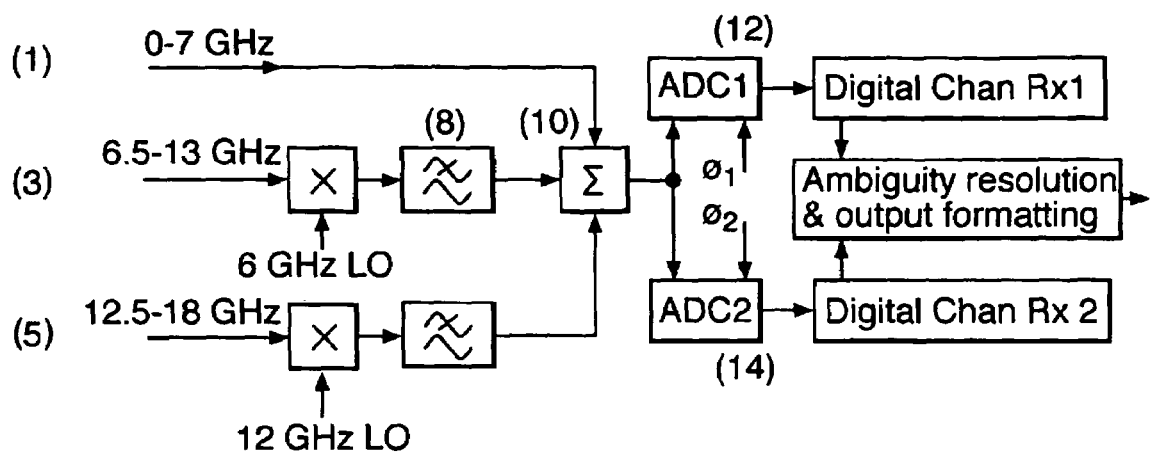
FIG. 3 is an example of a radar ESM system incorporating composite frequency mapping architecture using three sub-bands and adopting the process illustrated in FIG. 2, but having residual frequency ambiguities between the three sub-bands

In FIG. 3, a radar ESM is shown using both frequency translation and aliasing. The RF input is split into three frequency sub-bands, covering 0-7 (1), 6.5-13 (3) and 12.5-18 (5) GHz. The input RF bands have been adjusted slightly to allow for finite roll-off of the filters defining the input bands. The 6.5-13 GHz band (3) is down-converted in frequency by beating with a 13 GHz local oscillator (LO), so that it resembles a 0-7 GHz band, a low pass filter (8) being used to cut out the higher frequencies. A similar process is used with the higher sub-band (5) and an 18 GHz LO. In this embodiment, the three sub-bands are then recombined (10) although this is not essential to the invention. It would be possible to duplicate the circuitry three times, but this would have the disadvantage of added cost for little processing benefit.

The combined signal is sampled at two clock speeds, φ1 (12), φ2 (14) and the output frequencies compared and ambiguities resolved before being passed to two digital channel receivers (16), (18) to compare the input signals, providing signal detections with frequency measured in the range 0-7 GHz.

Figure 4:
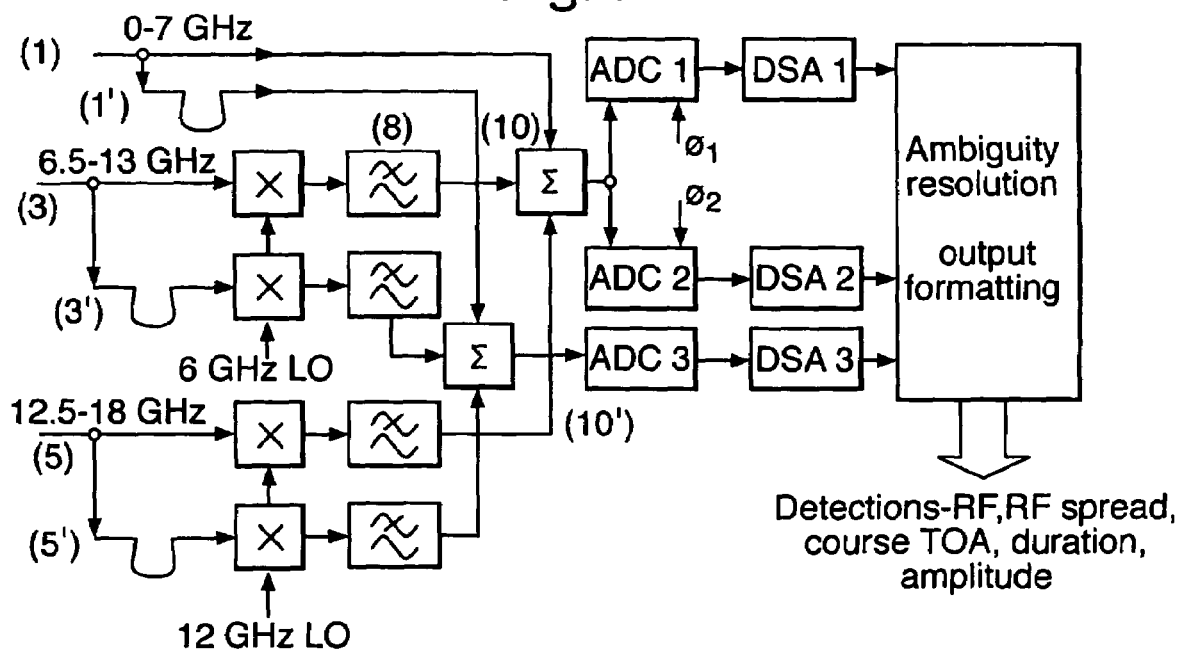

Turning now to FIG. 4, this shows how a system incorporating the invention would determine the input frequency and also discriminate between the sub-bands. In this figure, each of the three input sub-bands (1,3,5) is split into two channels, each of the second channel signals (1',3',5') being subject to a small nominally identical delay before being summed (10') in a similar manner to channels (1), (3), (5) as described in FIG. 3. This delay introduces a frequency dependent phase shift, which provides the additional phase information for allocating the detected signals to one of the three input sub-bands. This summed channel is subjected to sampling at ADC 3 at the same clock rate as the rate of ADC2.

Following all the three signals being analysed in the Digital Spectrum Analysers, the signals are treated for ambiguity resolution, and the output formatted. In this way, the input signal frequency can be deduced first within the sub-band by identifying the spectral peaks, and then the phase shift can be used to indicate which sub-band the signal arrived in by employing a digital spectral analyser (DSA) to analyse the whole signal.

Figure 5:
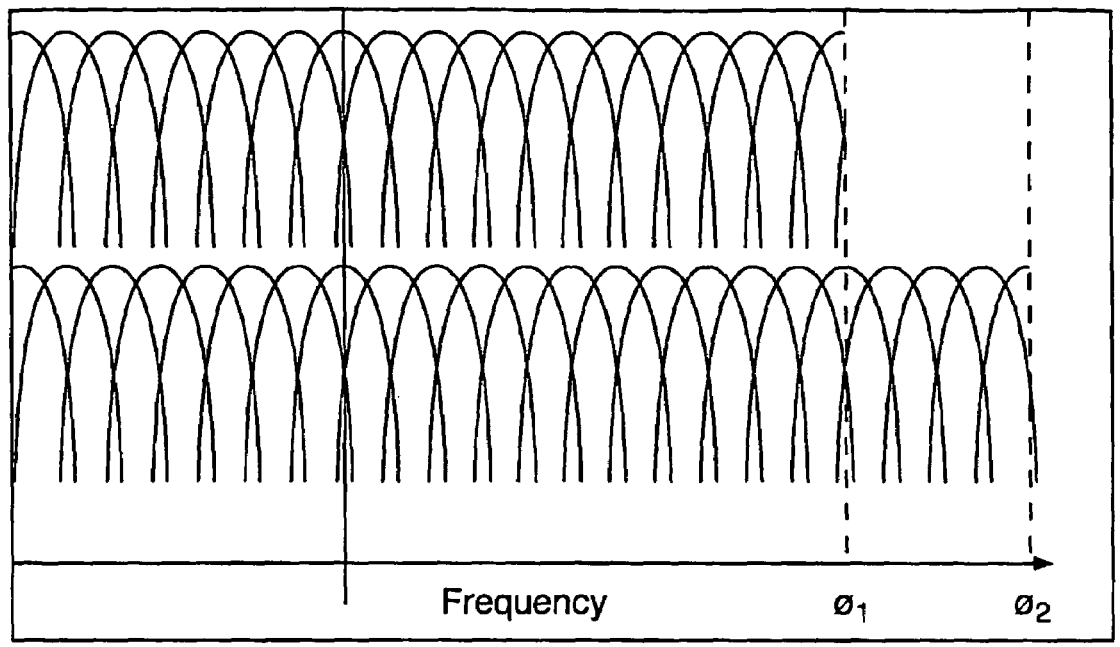
FIG. 5 shows the effect of matching the size of the Fourier Transform to the clock rate

In FIG. 5, the response is shown of the frequency bins for two FTs operating on a signal sampled at two rates, $Ø_1$ and $Ø_2$ chosen such that the ratio $N_1/Ø_1 = N_2/Ø_2$, where $N_1$ and $N_2$ are the numbers of points in each transform. The figure shows the exact alignment of the filters in the channels, and also that the two channels differ only in that the one with the higher sample rate has a corresponding number of extra higher frequency bins.

Figure 6:
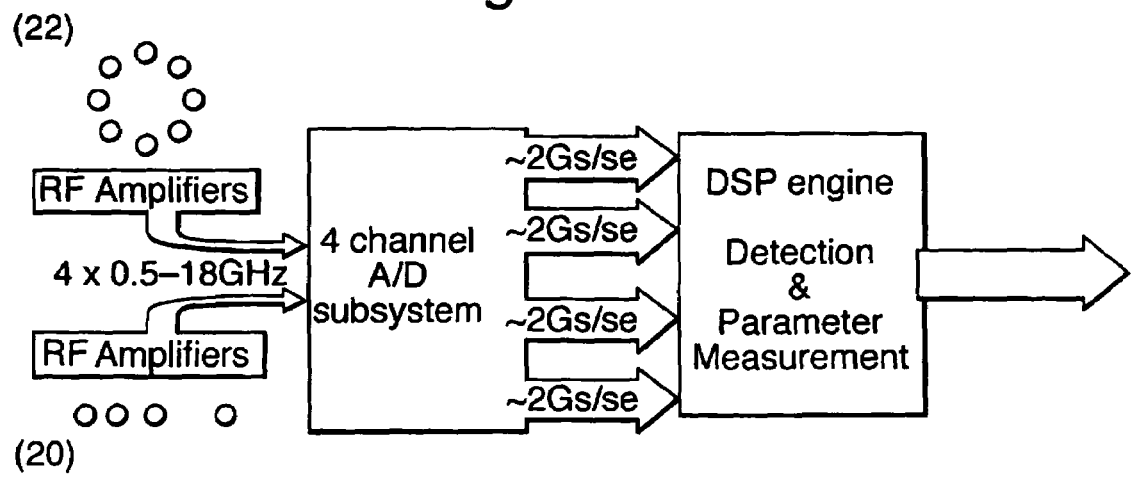
FIG. 6 shows an ESM system, with two alternative antenna arrangements and in which the bin size is matched to the sampling rate.

By making use of the arrangement shown in FIG. 5 between the FTs, FIG. 4 may now be simplified by the removal ADC2 and DSA2, preserving only ADC1 and ADC3, each operating at a different sample rate. In FIG. 6 a linear array (20) or a circular array (22) are be connected to an A/D converter that can accept input signal up to 18 GHz, but operates at sample rate of 2 GHz. In such a system, 4 different sample rates are fully adequate to resolve all frequency ambiguities over the full frequency range, whilst the ability to measure phase between the channels means that signal direction can be measured with no additional hardware. In this embodiment of the invention, the signal splitting occurs at the antenna by utilising the phase-related outputs of the antenna, typically an interferometer or circular array, for detection and unambiguous frequency measurement, by exploiting the different sampling rates employed in each channel. The frequency domain representations found in each channel for each detected signal can then be compared in phase, and the measured phase relationships used for direction finding according the appropriate algorithm for the interferometer arrangement or circular array. The arrangement utilises no additional receiver circuits to resolve frequency ambiguities over and above those needed for a digital direction finding receiver of conventional design with no frequency ambiguity.

The invention claimed is:

1. An apparatus for detecting and identifying an electromagnetic signal lying within a broad frequency band comprising:
 a receiving means;
 circuitry providing a plurality of channels to carry the signal;
 means associated with each of said channels for sampling the signal;
 processing means adapted to resolve ambiguities created in the output of each of said sampling means by sampling said channels at less than the Nyquist sampling rate for the channel being sampled;
 wherein each sampling means runs at a different clock rate from each other sampling means.

2. An apparatus as claimed in claim 1 in which the processing means comprises a digital spectrum analyser.

3. An apparatus as claimed in claim 2 which further comprises means for splitting the electromagnetic signal into a plurality of separate signal input sub-bands spread across the broad frequency band and means for effecting frequency translation of each of the separate signal input sub-bands to make each of the input sub-bands resemble the others, said splitting and frequency translation means being located before the sampling means.

4. An apparatus as claimed in claim 3 further comprising means for recombining the separate signal input sub-bands before sampling.

5. An apparatus as claimed in claim 2 in which the processing means is configured to employ a mathematical algorithm for effecting frequency transformations.

6. An apparatus as claimed in claim 5 in which the mathematical algorithm used is a Fourier Transform.

7. An apparatus as claimed in claim 6 in which the processing means processes a number of samples at a sample rate and in which the ratio of samples processed by the Fourier Transform algorithm to the sample rate is identical in two or more channels.

8. An apparatus as claimed in claim 5 in which the mathematical algorithm used is a Hartley Transform.

9. An apparatus as claimed in claim 2 including means provided prior to the sampling means, for sub-dividing each signal input band into two sub-bands and for causing one of the sub-bands to be subject to a phase shift with respect to the other by the introduction thereinto of a time delay.

10. An apparatus as claimed in claim 2 in which the receiving means is a circular antenna array.

11. An apparatus as claimed in claim 2 in which the receiving means is a linear antenna array.

12. An apparatus as claimed in claim 2 further comprising means, comprising an antenna, for splitting said electromagnetic signal into the channels.

13. An apparatus as claimed in claim 2 used to provide electronic support measures for a military platform.

14. A method of detecting and identifying an electromagnetic signal lying within a broad frequency band comprising:

detecting an electromagnetic signal;

relaying the signal into a plurality of output channels;

sampling each output channel at less than the Nyquist sampling rate for the channel being sampled;

processing the outputs to resolve ambiguities created in the output of each of said sampling means by sampling said channels;

wherein each output channel is sampled at a different clock rate from each other output channel.

15. A method as claimed in claim 14 in which processing of the outputs comprises using a digital spectrum analyser.

16. A method as claimed in claim 15 which comprises the further steps of splitting the detected signal into a plurality of separate signal input bands spread across the broad frequency band and subjecting the separate signal input bands to a frequency translation to make each of the input bands resemble the others prior to sampling the signal.

17. A method as claimed in claim 16 which comprises the further steps of further sub-dividing each of the separate signal input bands into two sub-bands and subjecting one of these sub-bands to a time delay in order to introduce a phase shift with respect to the other sub-band before sampling thereof.

18. A method as claimed in claim 15 in which the processing of the outputs includes effecting frequency transformation by the use of a mathematical algorithm.

19. A method as claimed in claim 18 in which the mathematical algorithm is a Fourier Transform.

20. A method as claimed in claim 19 in which processing of the outputs comprises processing a number of samples at a sample rate and in which the ratio of samples processed by the Fourier Transform algorithm to the sample rate is identical in two or more channels.

21. A method as claimed in claim 18 in which the mathematical algorithm is a Hartley Transform.

* * * * *